(12) United States Patent
Perner (10) Patent No.: US 7,009,417 B2
(45) Date of Patent: Mar. 7, 2006

(54) SEMICONDUCTOR MODULE AND METHODS FOR FUNCTIONALLY TESTING AND CONFIGURING A SEMICONDUCTOR MODULE

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 10/689,419

(22) Filed: Oct. 20, 2003

(65) Prior Publication Data
US 2004/0082121 A1    Apr. 29, 2004

(30) Foreign Application Priority Data
Oct. 18, 2002    (DE)    ............................... 102 48 753

(51) Int. Cl.
G01R 31/02    (2006.01)
(52) U.S. Cl. ...................................... 324/763; 324/765
(58) Field of Classification Search .............. 324/73.1, 324/158.1, 763–765; 714/724–734, 25; 711/118; 365/200–201
See application file for complete search history.

(56) References Cited

U.S. PATENT DOCUMENTS

| | | | | |
|---|---|---|---|---|
| 4,336,495 A | * | 6/1982 | Hapke ......................... | 324/765 |
| 4,970,454 A | * | 11/1990 | Stambaugh et al. ........ | 324/73.1 |
| 5,317,711 A | * | 5/1994 | Bourekas et al. ............ | 714/47 |
| 5,546,406 A | * | 8/1996 | Gillenwater et al. ........ | 714/733 |
| 5,553,236 A | * | 9/1996 | Revilla et al. ................. | 714/25 |
| 5,982,188 A | * | 11/1999 | Lysinger ..................... | 324/763 |
| 6,446,164 B1 | * | 9/2002 | Nguyen et al. ............. | 711/118 |

OTHER PUBLICATIONS

Dae-Young Jung et al. :Reusable Embedded Debugger for 32bit RISC Processor Using the JTAG Boundary Scan Architecture, Proceedings of the 2002 IEEE Asia Pacific Conference on ASIC, 2002, pp. 209-212.
E. de la Torre et al.: "Non-intrusive debugging using the JTAG interface of FPGA-based prototypes", Proceedings of the 2002 IEEE International Symposium on Industrial Electronics, 2002, pp. 666-671.

* cited by examiner

Primary Examiner—Vinh P. Nguyen
(74) Attorney, Agent, or Firm—Laurence A. Greenberg; Werner H. Stemer; Ralph E. Locher

(57) ABSTRACT

A semiconductor module has a plurality of contact terminals used for external data interchange, address interchange and/or command interchange during normal operation of the semiconductor module. The module further has at least one further contact terminal that is not used for external data interchange, address interchange and/or command interchange during normal operation. A mode of operation for ascertaining and outputting test information and, respectively, for configuring the semiconductor module during normal operation of the semiconductor module is initialized and set via a test and configuration circuit, which is connected to the further contact terminal, with data interchange, address interchange and/or command interchange simultaneously being effected during normal operation of the semiconductor module via the contact terminals. This provides a semiconductor module, which makes it possible to carry out a functional test or a configuration in proximity to the application even during normal operation of the module in the application.

29 Claims, 4 Drawing Sheets

SEMICONDUCTOR MODULE AND METHODS FOR FUNCTIONALLY TESTING AND CONFIGURING A SEMICONDUCTOR MODULE

BACKGROUND OF THE INVENTION

Field of the Invention

The present invention relates to a semiconductor module having a plurality of contact terminals which are used for external data interchange, address interchange and/or command interchange during normal operation of the semiconductor module and having at least one further contact terminal which is not used for external data interchange, address interchange and/or command interchange during normal operation of the semiconductor module. The present invention furthermore relates to methods for functionally testing and configuring a semiconductor module of this type.

Semiconductor modules such as, for example, semiconductor memory chips are used in various module configurations. The module configurations differ in particular in the number of data lines that are used and are connected to data connection pads ("I/O pads") in order to achieve a system bus width of varying bit width depending on the application. The data connection pads are used, for example, for interchanging data between the module and a system controller. In the field of semiconductor memory chips, in particular, there are what are referred to as x4, x8 and x16 module configurations that use 4, 8 or 16 data lines per module for interchanging data.

For the purpose of integration in a data processing system, semiconductor modules such as, for example, semiconductor memory chips are placed, for example, on a memory board (for example a "DIMM board") after being fitted in a housing ("package"). If, by virtue of its basic configuration, a semiconductor module can be used in all x4, x8 and x16 module configurations and accordingly can be configured in terms of the data width, which means that, for example, an x4 or x8 module configuration is provided, there are, in addition to contact terminals which are used for external data interchange, address interchange and/or command interchange during normal operation of the semiconductor module, correspondingly unused contact terminals or terminal pins ("no connects") which are not electrically connected to the chip ("die") via a bonding wire within the module. The advantage of the wiring method is that no undesired parallel-path currents or leakage currents can flow. No function is assigned to contact terminals of this type for the specified function of the semiconductor module during normal operation.

Semiconductor modules such as integrated memories, for example in the form of dynamic random access memories (DRAMs), are generally subjected to comprehensive functional tests during the fabrication process. These functional tests serve, inter alia, to identify defective memory cells, defective column lines or row lines or generally defective circuit sections. Additional operating modes that go beyond the method of operation of normal operation are usually implemented in terms of circuitry on the semiconductor module for checking, testing or configuration purposes. Circuits of this type may be, for example, self-test units, measurement circuits or configuration circuits which make it possible to generate electrical or other physical state parameters regarding the semiconductor module and communicate them to the user and, respectively, to configure the module.

In the case of semiconductor memory components, the circuits for activating the modes are addressed, for example, by an appropriate signal code sequence in the "mode register set" mode, the signal code sequence being transmitted via the address contact terminals. Function parameters having any additional arguments are subsequently appended to the signal sequence. The test and configuration mode activation and the corresponding function codes are generally known only by the manufacturer of the components. It goes without saying that, by disclosing a second access code, the customer could be provided with a broader functionality and configurability than has hitherto been possible using what is referred to as a mode register set or extended mode register set.

The disadvantage of carrying out functional tests and configurations, respectively, in this manner is that the method of operation of the module in the application would be impaired if contact terminals which are essential for the method of operation of the module during normal operation were used otherwise for test or configuration purposes. On the other hand, it would be advantageous to carry out a functional test and, respectively, a configuration in proximity to the application during operation of the module in the application.

SUMMARY OF THE INVENTION

It is accordingly an object of the invention to provide a semiconductor module and methods for functionally testing and configuring a semiconductor module that overcome the above-mentioned disadvantages of the prior art devices and methods of this general type, which makes it possible to carry out a functional test and, respectively, a configuration of the module, even during normal operation of the module in the application, without thereby impairing the function of the module.

With the foregoing and other objects in view there is provided, in accordance with the invention, a semiconductor module. The module contains a plurality of contact terminals used for external data interchange, address interchange and/or command interchange during normal operation, and at least one further contact terminal not used for external data interchange, address interchange and/or command interchange during the normal operation of the semiconductor module. A main circuit is provided for testing the semiconductor module. The main circuit is connected to the further contact terminal and configured such that a mode of operation for ascertaining and outputting test information during the normal operation of the semiconductor module may be initialized and set through the further contact terminal. It being possible to simultaneously carry out data interchange, address interchange and/or command interchange during the normal operation of the semiconductor module through the contact terminals.

In addition to a plurality of contact terminals which are used for external data interchange, address interchange and/or command interchange during normal operation of the module, the semiconductor module according to the invention has at least one further contact terminal which is not used for external data interchange, address interchange and/or command interchange during normal operation of the semiconductor module. The invention provides a circuit for testing and, respectively, configuring the semiconductor module, the test and configuration circuit is connected to the further contact terminal and is configured in such a manner that a mode of operation for ascertaining and outputting test information and, respectively, for configuration during normal operation of the semiconductor module may be initialized and set via the further contact terminal. In this case, the test and configuration circuit is configured in such a manner that, during operation of the circuit, it is possible to simultaneously carry out data interchange, address interchange and/or command interchange during normal operation of the semiconductor module via the contact terminals.

The invention thereby provides a semiconductor module, which makes it possible to carry out, in proximity to the application, a functional test and, respectively, a configuration even during normal operation of the module in the application. By suitable configuration of the test and configuration circuit and by communication of the circuit via the further contact terminal, which is not used for external data interchange, address interchange and/or command interchange during normal operation of the semiconductor module, it is possible to achieve the situation in which the function of the module in the application is not impaired thereby. In this case, the invention has the additional advantage that not only can the semiconductor module be tested and, respectively, configured at the wafer level but also when it has been packaged in the housing and applied to the application it can be operated in parallel and simultaneously be subjected to a functional test and, respectively, a configuration in proximity to the application. In this case, parallel configuration operation has the advantage that it is possible to dispense with transmitting configuration data via the "normal" contact terminals and thus to dispense with interrupting a data, address or command sequence.

In one embodiment of the method according to the invention, an input code evaluation is performed by interrogating the state of the further contact terminal, the evaluation being executed until an interrogated input code for initializing a test sequence or a configuration sequence matches a predetermined input code. By way of example, voltage values which have been applied to the further contact terminal are permanently evaluated in synchronism with a system clock. In this case, the further contact terminal is configured, for example, as "active high" as standard and should always be connected to a constant low level. The transmission of an input code signal sequence serves to authenticate subsequent test operation.

If the result of the input code evaluation is positive, a function code evaluation is subsequently performed by interrogating the state of the further contact terminal. The function code evaluation is executed until an interrogated function code for setting a test sequence matches a predetermined function code. Operating states of the semiconductor module during test operation or configuration operation may be influenced and set with the aid of the function code. This makes it possible to control specified measurement and control operations in the functional test and, respectively, to set configurations during configuration operation. During test operation, test information is subsequently output during normal operation of the semiconductor module.

In an embodiment which is advantageous in this regard, a parameter evaluation for executing a test sequence is subsequently performed between the function code evaluation and outputting of the test information (if the result of the function code evaluation is positive) by interrogating the state of the further contact terminal. This makes it possible to further influence operating states of the semiconductor module during the functional test or to further influence the execution of the test sequence. This may also be applied analogously to configuration operation of the module.

In an advantageous embodiment of the invention, an output start command is decoded at the further contact terminal for the purpose of outputting test information and test information is subsequently output via another of the contact terminals until an output stop command is decoded at the further contact terminal. The other contact terminal may be configured, for example, as a second further contact terminal, which is likewise not assigned a function for the specified function of the semiconductor module during normal operation.

In another embodiment, the other contact terminal may be configured as a "normal" contact terminal, which is used, for example, for address interchange during normal operation of the semiconductor module. In this case, test information is in particular output toward the outside when the address terminal is not required in the meantime for normal operation. The use of a plurality of contact terminals of this type makes it possible to momentarily broaden the data bus width in a targeted manner for the purpose of driving out test information.

In an advantageous embodiment of the semiconductor module according to the invention, the test and configuration circuit contains a first reception circuit, which may be connected to the further contact terminal and may be used to receive and decode an input code sequence for initializing a test sequence or a configuration sequence. A second reception circuit, which may be used to receive and decode a function code sequence for setting a test sequence or a configuration sequence, may likewise be connected to the further contact terminal. In this case, the second reception circuit is released by the first reception circuit, once the input code sequence has been received and decoded, for the purpose of receiving the function code sequence. Once the function code sequence has been received and decoded, the second reception circuit sets a mode of operation for ascertaining and outputting test information and, respectively, for configuration during normal operation of the semiconductor module. The cascade-like configuration of the reception circuits makes it possible to sequentially evaluate the input code and function code in a comparatively simple manner in terms of circuitry.

According to one embodiment of the invention, the further contact terminal, via which the input code sequence is transmitted, is configured not only as an "input pin" but also as an "output pin". An output circuit for outputting test information which has been ascertained is accordingly likewise connected to the further contact terminal. The output circuit is furthermore connected to a measurement circuit, which is used for ascertaining test data regarding the method of operation of the semiconductor module. Therefore not only are the code sequences transmitted to the semiconductor module via the further contact terminal but the test data which have been ascertained are also transmitted toward the outside via the further contact terminal.

In an alternative embodiment thereto, the output circuit is connected to a second further contact terminal, which is likewise not assigned a function for the specified function of the semiconductor module during normal operation. In this case, the output circuit outputs, toward the outside via the second further contact terminal, the test data which have been ascertained by the measurement circuit. This makes it possible for one or more additional pure output pins to be released in order to permanently drive test data (to be output) until the further contact terminal acting as the input pin receives a stop command or becomes inactive, with the result that the function of the test operation and the process of driving the test data are terminated. One or more output pins of this type may also, as described above, be configured as "normal" contact terminals, for example for the purpose of transmitting addresses. In this case, the data bus width may advantageously be broadened momentarily for the purpose of driving out test information.

In accordance with an added embodiment of the invention, the first reception circuit contains a first shift register connected to the further contact terminal for serially receiving input code signal sequences, a first register circuit for storing a digitally coded input code, a first comparison circuit connected to and comparing contents of the first shift register and of the first register circuit, and a first enable circuit connected to the further contact terminal and to the second reception circuit. The first enable circuit being driven by the first comparison circuit.

In accordance with a further feature of the invention, the main circuit contains a sub-circuit being a measurement circuit for ascertaining test data regarding a method of operation of the semiconductor module or a configuration circuit for configuring the semiconductor module. The second reception circuit contains a second shift register connected to the first reception circuit and serially receiving function code signal sequences, a second register circuit for storing digitally coded function codes, a second comparison circuit connected to and comparing contents of the second shift register and of the second register circuit, and a second enable circuit coupled to the further contact terminal and to one of the measurement circuit and the configuration circuit. The second enable circuit being driven by the second comparison circuit.

In accordance with another feature of the invention, the measurement circuit for ascertaining test data regarding the method of operation of the semiconductor module contains a third shift register coupled to the further contact terminal and serially receiving parameter signal sequences for executing a test sequence, a control unit connected to the third shift register and to the second reception circuit, and a measurement unit connected to and controlled by the control unit and measuring electrical parameters for ascertaining test data regarding the method of operation of the semiconductor module.

In accordance with another feature of the invention, the configuration circuit for configuring the semiconductor module contains a third shift register connected to the further contact terminal and serially receiving parameter signal sequences for executing a configuration process, a control unit connected to the third shift register and to the second reception circuit, and a configuration register connected to the control unit and storing configuration settings.

In accordance with a further added feature of the invention, a measurement circuit is provided for ascertaining test data regarding a method of operation of the semiconductor module. An output circuit is coupled to the further contact terminal and to the measurement circuit. The output circuit outputs the test data that have been ascertained toward an outside through the further contact terminal.

Other features which are considered as characteristic for the invention are set forth in the appended claims.

Although the invention is illustrated and described herein as embodied in a semiconductor module and methods for functionally testing and configuring a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
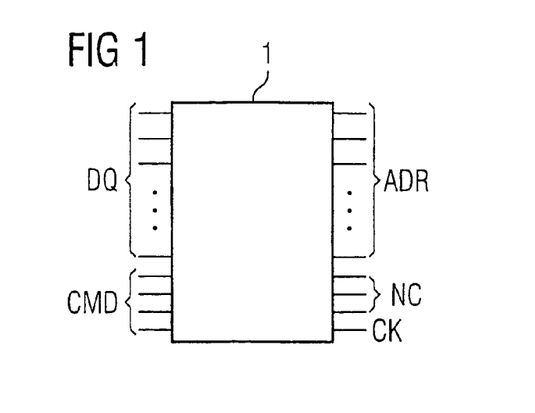
FIG. 1 is a block diagram of a semiconductor module having various contact terminals.

Referring now to the figures of the drawing in detail and first, particularly, to FIG. 1 thereof, there is shown diagrammatically an illustration of a semiconductor module 1 having various types of contact terminal. Data terminals DQ are used for external data interchange, for example between a non-illustrated controller and the semiconductor module 1. Address terminals ADR and command terminals CMD are used for address interchange and command interchange, respectively, between the semiconductor module 1 and the aforementioned controller, for example. The semiconductor module 1 has further contact terminals NC which are not used for external data interchange, address interchange and/or command interchange during normal operation of the semiconductor module. These contact terminals NC constitute terminal pins that are not used for actual normal operation of the semiconductor module. In the case of conventional semiconductor modules, terminals of this type are often referred to as "no connects" which are not electrically connected to the "die" via a bonding wire within the module. In the semiconductor module 1 shown in FIG. 1, a contact terminal CK is furthermore provided for the purpose of receiving a clock signal.

Figure 2A:
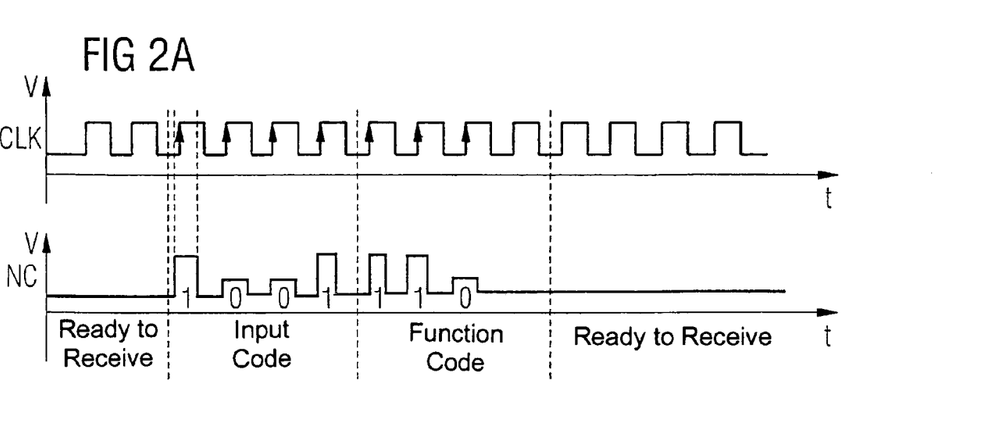
FIGS. 2A and 2B are signal diagrams for operating a semiconductor module according to the invention.

FIGS. 2A, 2B shows signal diagrams for operating a semiconductor module according to the invention. An upper part of the signal diagram shown in FIG. 2A illustrates the clock signal CLK, which is received at the contact terminal CK shown in FIG. 1. A lower part of the signal diagram shown in FIG. 2A shows a signal profile of a signal at one of the contact terminals NC shown in FIG. 1. Signals, the voltage V of which varies with time t, are respectively illustrated.

Figure 2B:
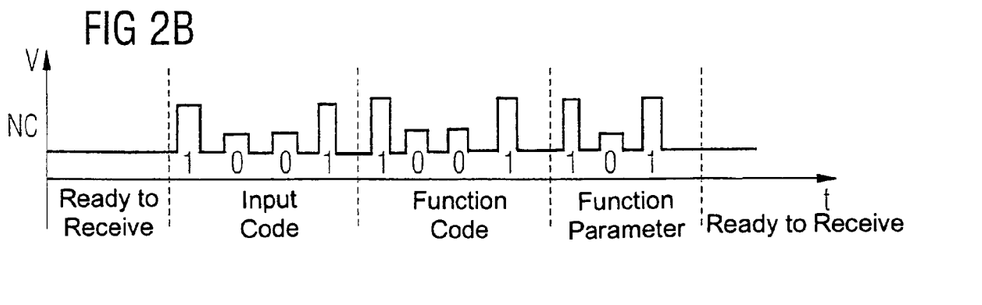

In this application example, a mode of operation for ascertaining and outputting test information during normal operation of the semiconductor module is initialized and set via the contact terminal NC shown in FIGS. 2A, 2B. This example and the following figures and embodiments may also be analogously applied to configuration or initialization operation, in which corresponding signal sequences for initializing and transmitting configuration sequences and parameters, respectively, are applied, for example for the purpose of setting an operating voltage of the module.

The contact terminal NC is initially ready to receive. When a signal sequence is applied to the terminal NC, an input code evaluation is first performed by interrogating the state of the contact terminal NC. The evaluation is executed until an interrogated input code for initializing a test sequence matches a predetermined input code. In the simplest case, the input code signal sequence assumes the states "1" and "0" in this case. However, the input levels may also be coded by n-tuple multilevel multiplexing. If the result of the input code evaluation is positive, a function code evaluation is subsequently performed by interrogating the state of the contact terminal NC. The function code evaluation is executed until an interrogated function code for setting a test sequence matches a predetermined function code. In the simplest case, the function code sequence also assumes the states "1" and "0". Test information is subsequently output, for example via another of the terminals NC, the terminal NC changing to reception readiness again for the purpose of receiving the code sequences shown in FIG. 2A. This also occurs analogously after configuration operation has been terminated.

FIG. 2B shows a further signal diagram similar to the signal diagram shown in FIG. 2A. In contrast to FIG. 2A, once the result of the function code evaluation is positive, a parameter evaluation is subsequently performed in the exemplary embodiment shown in FIG. 2B, it being possible to further influence the execution of a test sequence in a targeted manner by transmitted function parameters (likewise having the states "1" and "0" in the simplest case). The parameter evaluation is likewise performed by interrogating the state of the contact terminal NC. Following the function parameter evaluation, test information is subsequently output during normal operation of the semiconductor module, for example via a further one of the contact terminals NC, the contact terminal NC shown in FIG. 2B changing to reception readiness.

Figure 3:
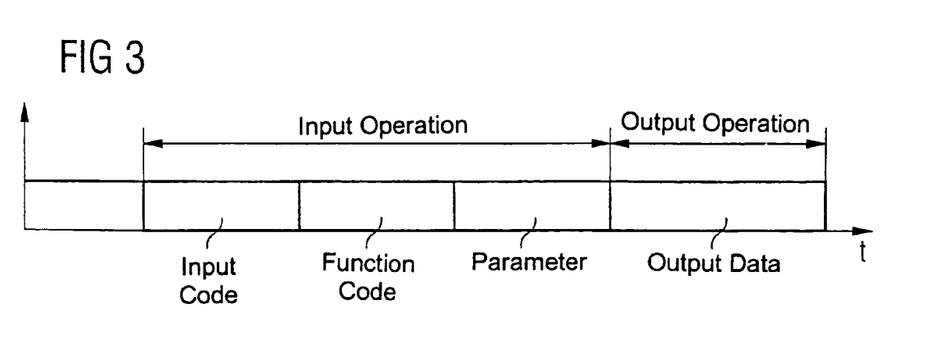
FIG. 3 is an illustration of a temporal sequence of various modes of operation during a functional test of a semiconductor module according to the invention.

FIG. 3 shows an illustration of a temporal sequence of various modes of operation during the functional test, the illustration being intended to show once again the functional test sequence described with reference to FIG. 2A, 2B. The input code, function code and parameter evaluations already described are effected during input operation via one of the terminals NC of the semiconductor module 1 shown in FIG. 1. Output data for transmitting test information to outside the semiconductor module 1 are subsequently transmitted during an output operation. In this case, it is possible to use the same contact terminal NC as was also used for input operation or else a further one of the contact terminals NC, which in this case acts as an exclusive output pin. It is furthermore conceivable for an output operation to be implemented via one of the contact terminals ADR, CMD or DQ that is not being used in the meantime for normal operation of the semiconductor module 1.

Figure 4:
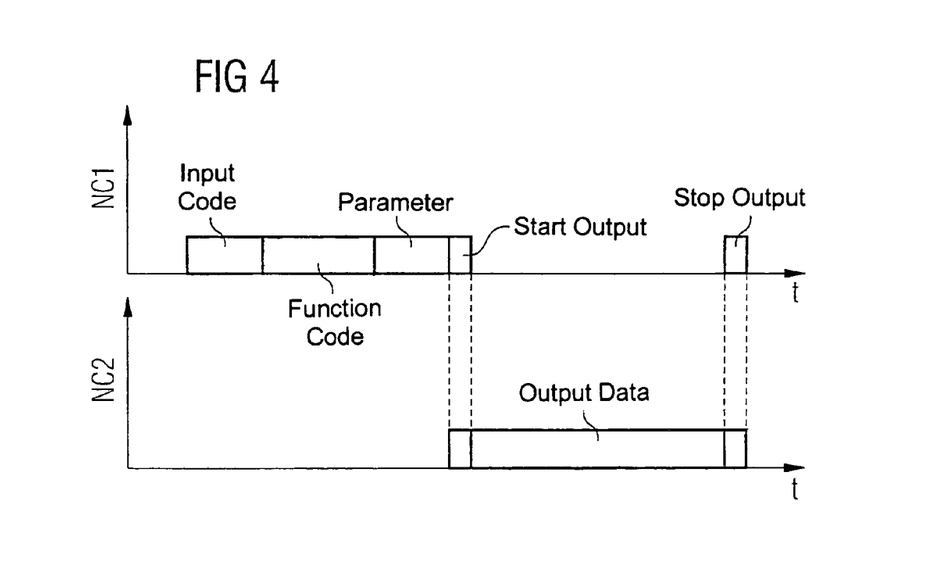
FIG. 4 is an illustration of a temporal sequence of various modes of operation during a functional test of a semiconductor module according to the invention.

FIG. 4 shows a further illustration of a temporal sequence of various modes of operation during a functional test of the semiconductor module according to the invention, the illustration showing separate input operation via contact terminal NC1 and output operation via contact terminal NC2. Following the parameter evaluation, an output start command, which is decoded at the contact terminal NC1, is transmitted for the purpose of outputting test information. Output data for transmitting test information are subsequently transmitted via the contact terminal NC2 until an output stop command is decoded at the contact terminal NC1. One or more further contact terminals (contact terminal NC2 in the present exemplary embodiment) are thus released via the contact terminal NC1, the further contact terminals being able in principle to drive analog or digital data out of the semiconductor module over an arbitrary period of time as long as outputting is not terminated via the terminal NC1.

Figure 5:
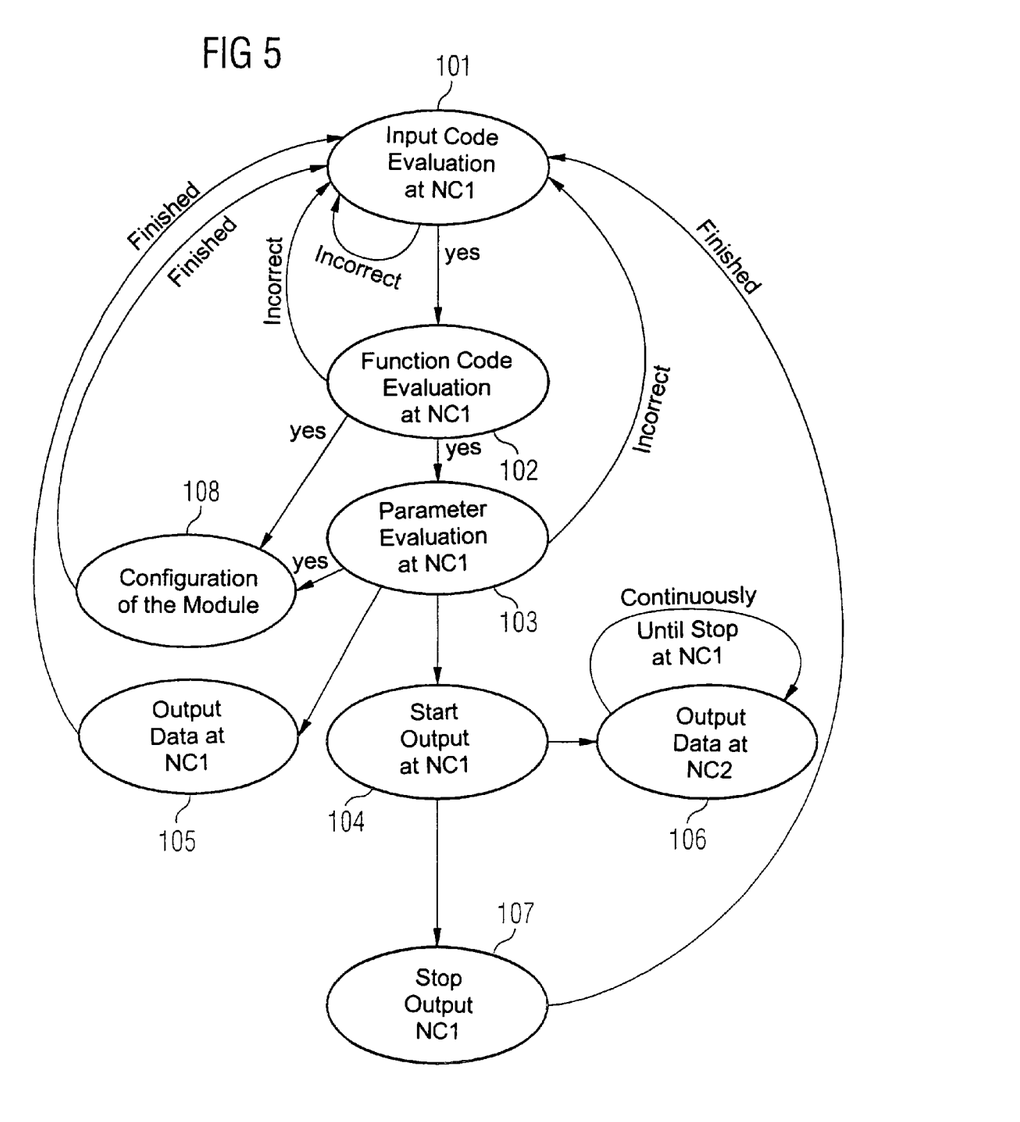
FIG. 5 is a flowchart of a method according to the invention for functionally testing and, respectively, configuring a semiconductor module according to the invention.

FIG. 5 shows a flowchart of a method according to the invention for functionally testing and, respectively, configuring a semiconductor module according to the invention, the flowchart once again illustrating the above-described sequences and code evaluations. In the initial state, the contact terminal NC1 is ready to receive an input code sequence. As soon as a signal sequence is received, an input code evaluation (state 101) is performed. If the result of the input code evaluation is positive, a function code evaluation (state 102) is subsequently performed. If the evaluation is incorrect, resetting to the initial state is effected. If the result of the function code evaluation is positive, a parameter evaluation (state 103) is subsequently performed.

There is then a choice of two alternative concepts for outputting test information. In a first embodiment, the same contact terminal NC1 as was used to transmit the code sequences is changed to an output pin (state 105) for a certain amount of time for the purpose of outputting test information. In another embodiment, an output start command is issued at the contact terminal NC1 (state 104), whereupon corresponding output data are continuously output at the contact terminal NC2 until a stop command is detected at the terminal NC1 (states 106, 107).

In configuration operation, in contrast, no information is driven toward the outside; rather, following the function code evaluation and parameter evaluation, the module is configured (state 108) with or without corresponding parameters. In this case, for example, configuration values are written to a corresponding configuration register.

Figure 6:
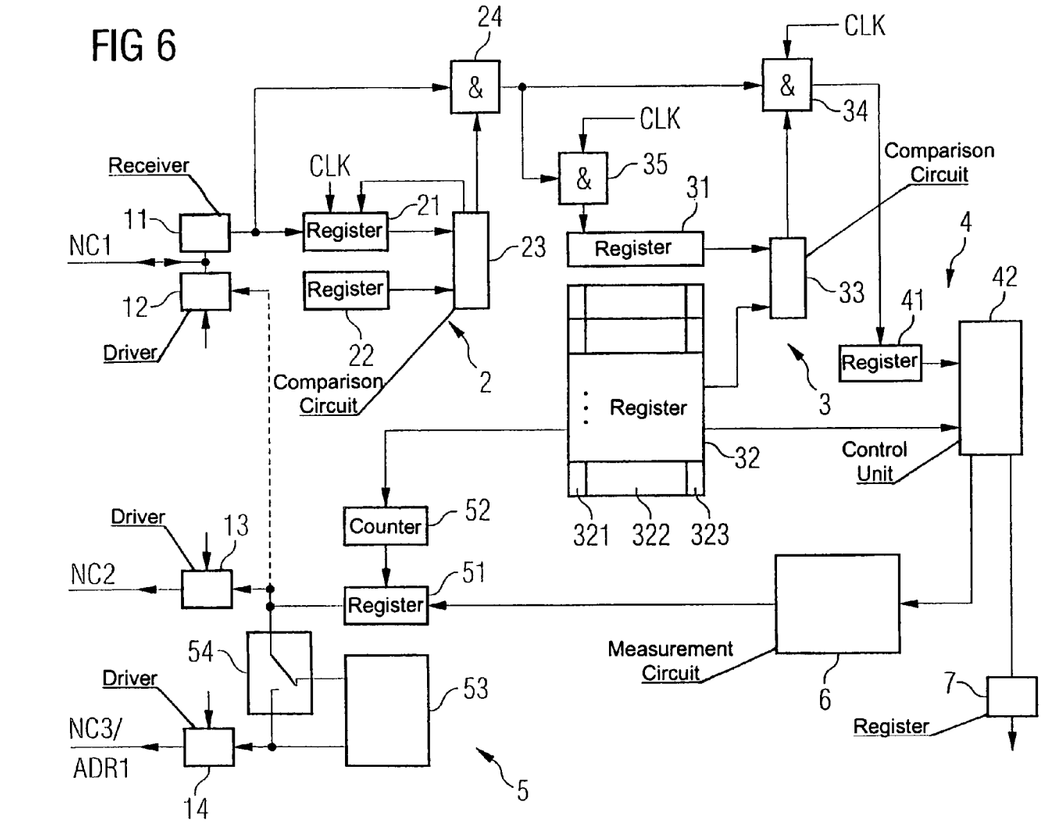
FIG. 6 is a block circuit diagram of a semiconductor module according to the invention.

FIG. 6 shows an embodiment of a circuit configuration of a semiconductor module according to the invention, it being possible to use the circuit configuration to carry out a functional test and configuration of the semiconductor module in parallel with normal operation of the latter. The circuit configuration shown in FIG. 6 is connected to the contact terminals NC1, NC2 and NC3 that are not used for external data interchange, address interchange and/or command interchange during normal operation of the semiconductor module. The contact terminal NC1 is connected to an input receiver 11 and to an output driver 12. The contact terminals NC2 and NC3 are connected to output drivers 13 and 14, respectively. The test and configuration circuit, which is connected to the contact terminal NC1, has a first reception circuit 2, a second reception circuit 3, a measurement circuit 4, 6, a configuration circuit 4, 7 and an output circuit 5.

The reception circuit 2 contains a first register in the form of a shift register 21, which is connected to the contact terminal NC1 via the corresponding input receiver 11. Input code signal sequences are received serially by the shift register 21. A digitally coded input code is stored in a first register circuit 22. The first shift register 21 and the first register circuit 22 are connected to a first comparison circuit 23, which is used to compare the contents of the shift register 21 and of the register circuit 22. A first enable circuit 24 in the form of an AND gate is furthermore provided, the AND gate 24 is connected to the contact terminal NC1 and to the second reception circuit 3. In this case, the gate 24 is driven or released by the comparison circuit 23. The shift register 21 is stopped via the comparison circuit 23 following release of the gate 24 and it is reset in the event of incorrect code transmission.

An input code evaluation is thus performed in the reception circuit 2 by interrogating the state of the contact terminal NC1, the gate 24 effecting a release if an interrogated input code matches a predetermined input code stored in the register circuit 22. A test sequence or configuration sequence to be subsequently implemented is initialized thereby.

The second reception circuit 3 contains a second register in the form of a shift register 31, which is connected to the first reception circuit 2 via an AND gate 35. In this case, the shift register 31 serially receives function code signal sequences that are applied to the terminal NC1 and are switched through via the gate 24. A second register circuit 32 serves to store digitally coded function codes. An option code, which can be used to select a defined type of test sequence or configuration sequence, is stored, for example, at bit position 321. The number of parameter values to be expected is stored at bit position 322 and a bit counter parameter value is stored at bit position 323. A second comparison circuit 33 serves to compare the contents of the shift register 31 and of the register circuit 32. As in the reception circuit 2, a second enable circuit 34 in the form of an AND gate is provided, it being possible for the enable circuit 34 to be connected to the contact terminal NC1 via the gate 24 and, on the other hand, to the circuit 4. The enable circuit 34 is driven and released by the comparison circuit 33.

If the result of the input code evaluation in the reception circuit 2 is positive, a function code evaluation is accordingly performed in the reception circuit 3 by interrogating the state of the contact terminal NC1. The function code evaluation is carried out until an interrogated function code for setting a test sequence or configuration sequence matches a function code stored in the register 32, that is to say the gate 34 is released.

The measurement circuit 4, 6 serves to ascertain test data regarding the method of operation of the semiconductor module. It contains a third register in the form of a shift register 41, which may be connected to the contact terminal NC1 via the gates 24 and 34 and serves to serially receive parameter signal sequences which are used for executing a test sequence. Provision is furthermore made for a control unit 42, which is connected to the shift register 41 and to the second reception circuit 3 or the register circuit 32 thereof. The control unit 42 is used in this application to control a measurement unit 6, which is used in this case to measure and ascertain electrical parameters for ascertaining test data regarding the method of operation of the semiconductor module.

The configuration circuit 4, 7 serves to configure the semiconductor module. It too contains the third register in the form of the shift register 41, which may be connected to the contact terminal NC1 via the gates 24 and 34 and serves to serially receive parameter signal sequences which are used in this application for executing a configuration sequence. In this application, the control unit 42 drives a configuration register 7 for storing configuration settings, in particular a mode register or extended mode register of the semiconductor module (MRS or Extended MRS Register).

The measurement unit 6 is connected to the output circuit 5, which has a result register 51, a counter register 52, an analog/digital converter 53 and also a switch 54. Via the output circuit 5, the test data that have been ascertained by the measurement unit 6 are output toward the outside via one of the contact terminals. In the case of the contact terminal NC1 acting both as an input pin and as an output pin, the output circuit 5 is connected to the terminal (illustration shown by a dashed line in FIG. 6). In an alternative embodiment, the output circuit 5 is connected to the contact terminals NC2 and NC3. It would also be conceivable in this case for the output circuit 5 to be connected instead to a "normal" contact terminal, for example an address terminal ADR1, in order to be able, in the meantime, to drive out test data toward the outside in periods of time in which an address is not being read into the semiconductor module.

In this case, the switch 54 makes it possible to switch in the analog/digital converter 53, with the result that the output circuit 5 can be used to output both analog and digital test data toward the outside via the contact terminal NC3.

Both the control unit 42 and the counter register 52 of the output circuit 5 are driven by the register circuit 32 of the reception circuit 3. In this case, the parameter magnitude at bit position 322 of the control unit 42 indicates the length of time for which a parameter sequence is read in at the terminal NC1 via the register 41. The parameter value stored at bit position 323 indicates to the output circuit 5 or to the counter register 52, respectively, the length of the test result read out by the measurement unit 6. In a manner dependent thereon, the result register 51 is driven by the counter register 52. A functionality is thus implemented, in accordance with which the reception circuit 3, following detection of the function code, enables the output circuit for the purpose of outputting the test data which have been ascertained or the test circuit as a whole enables the output circuit for the purpose of outputting the test data which have been ascertained.

I claim:

1. A semiconductor module, comprising:
   a plurality of contact terminals used for external data interchange, address interchange and/or command interchange during normal operation;
   at least one further contact terminal not used for external data interchange, address interchange and/or command interchange during the normal operation of the semiconductor module; and
   a main circuit for testing the semiconductor module, said main circuit connected to said further contact terminal and configured such that a mode of operation for ascertaining and outputting test information during the normal operation of the semiconductor module may be initialized and set through said further contact terminal, it being possible to simultaneously carry out data interchange, address interchange and/or command interchange during the normal operation of the semiconductor module through said contact terminals;
   said main circuit including:
      a first reception circuit connected to said further contact terminal for receiving and decoding an input code sequence for initializing a test sequence or a configuration sequence; and
      a second reception circuit coupled to said further contact terminal for receiving and decoding a function cods sequence for setting the test sequence or the configuration sequence, said second reception circuit being released, once the input code sequence has been received and decoded, by said first reception circuit, for the purpose of receiving the function code sequence, it being possible, once the function code sequence has been received and decoded, for said second reception circuit to be used to set the mode of operation for ascertaining and outputting test information and, respectively, for configuring the semiconductor module during the normal operation of the semiconductor module.

2. The semiconductor module according to claim 1, wherein said first reception circuit contains:
- a first shift register connected to said further contact terminal for serially receiving input code signal sequences;
- a first register circuit for storing a digitally coded input code;
- a first comparison circuit connected to and comparing contents of said first shift register and of said first register circuit; and
- a first enable circuit connected to said further contact terminal and to said second reception circuit, said first enable circuit being driven by said first comparison circuit.

3. The semiconductor module according to claim 2, wherein:
- said main circuit contains a sub-circuit selected from the group consisting of a measurement circuit for ascertaining test data regarding a method of operation of the semiconductor module and a configuration circuit for configuring the semiconductor module; and
- said second reception circuit contains:
  - a second shift register connected to said first reception circuit and serially receiving function code signal sequences;
  - a second register circuit for storing digitally coded function codes;
  - a second comparison circuit connected to and comparing contents of said second shift register and of said second register circuit; and
  - a second enable circuit coupled to said further contact terminal and to one of said measurement circuit and said configuration circuit, said second enable circuit being driven by said second comparison circuit.

4. The semiconductor module according to claim 3, wherein said measurement circuit for ascertaining test data regarding the method of operation of the semiconductor module contains:
- a third shift register coupled to said further contact terminal and serially receiving parameter signal sequences for executing a test sequence;
- a control unit connected to said third shift register and to said second reception circuit; and
- a measurement unit connected to and controlled by said control unit and measuring electrical parameters for ascertaining test data regarding the method of operation of the semiconductor module.

5. The semiconductor module according to claim 3, wherein said configuration circuit for configuring the semiconductor module contains:
- a third shift register connected to said further contact terminal and serially receiving parameter signal sequences for executing a configuration process;
- a control unit connected to said third shift register and to said second reception circuit; and
- a configuration register connected to said control unit and storing configuration settings.

6. The semiconductor module according to claim 1, further comprising:
- a measurement circuit for ascertaining test data regarding a method of operation of the semiconductor module; and
- an output circuit coupled to said further contact terminal and to said measurement circuit, said output circuit outputting the test data which have been ascertained toward an outside through said further contact terminal.

7. The semiconductor module according to claim 6, wherein said output circuit can be used to output both analog and digital test data toward an outside through said further contact terminal.

8. The semiconductor module according to claim 1, further comprising:
- at least one additional further contact terminal which is not used for external data interchange, address interchange and/or command interchange during the normal operation of the semiconductor module;
- a measurement circuit for ascertaining test data regarding a method of operation of the semiconductor module; and
- an output circuit connected to said additional further contact terminal and to said measurement circuit, said output circuit outputting the test data which have been ascertained toward an outside through said additional further contact terminal.

9. The semiconductor module according to claim 8, wherein said output circuit is connected to said main circuit for testing the semiconductor module, said main circuit for testing the semiconductor module enabling said output circuit for outputting the test data which have been ascertained.

10. The semiconductor module according to claim 1, further comprising:
- a measurement circuit for ascertaining test data regarding a method of operation of the semiconductor module; and
- an output circuit connected to at least one of said contact terminals and to said measurement circuit, said output circuit outputting the test data which have been ascertained toward and outside through said one of said contact terminals.

11. A semiconductor module, comprising:
- a plurality of contact terminals used for external data interchange, address interchange and/or command interchange during normal operation of the semiconductor module;
- at least one further contact terminal not used for external data interchange, address interchange and/or command interchange during the normal operation of the semiconductor module; and
- a main circuit for configuring the semiconductor module, said main circuit connected to said further contact terminal and configured such that a mode of operation for configuring the semiconductor module during the normal operation may be initialized and set through said further contact terminal, it being possible to simultaneously carry out data interchange, address interchange and/or command interchange during the normal operation of the semiconductor module through said contact terminals;
- said main circuit containing:
  - a first reception circuit connected to said further contact terminal for receiving and decoding an input code sequence for initializing a test sequence or a configuration sequence; and
  - a second reception circuit coupled to said further contact terminal for receiving and decoding a function code sequence for setting the test sequence or the configuration sequence, said second reception circuit being released, once the input code sequence has been received and decoded, by said first reception circuit, for the purpose of receiving the function code sequence, it being possible, once the function code sequence has been received and decoded, for said second reception circuit to be used to set a mode of operation for ascertaining and outputting test information and, respectively, for configuring the semiconductor module during the normal operation of the semiconductor module.

12. The semiconductor module according to claim 11, further comprising a configuration register for storing configuration settings for configuring the semiconductor module provided by parameter signal sequences applied to said at least one further contact terminal not used for external data interchange, address interchange and/or command interchange during the normal operation of the semiconductor module and connected to said main circuit.

13. The semiconductor module according to claim 12, wherein said configuration register is a mode register.

14. The semiconductor module according to claim 12, wherein said parameter signal sequences include parameters for the purpose of setting an operating voltage of the module.

15. The semiconductor module according to claim 11, wherein said first reception circuit contains:
   a first shift register connected to said further contact terminal and serially receiving input code signal sequences;
   a first register circuit for storing a digitally coded input code;
   a first comparison circuit connected to and comparing contents of said first shift register and of said first register circuit; and
   a first enable circuit connected to said further contact terminal and to said second reception circuit, said first enable circuit being driven by said first comparison circuit.

16. The semiconductor module according to claim 15, wherein:
   said main circuit contains a sub-circuit selected from the group consisting of a measurement circuit for ascertaining test data regarding a method of operation of the semiconductor module and a configuration circuit for configuring the semiconductor module; and
   said second reception circuit contains:
      a second shift register connected to said first reception circuit and serially receiving function code signal sequences;
      a second register circuit for storing digitally coded function codes;
      a second comparison circuit connected to and comparing contents of said second shift register and of said second register circuit; and
      a second enable circuit coupled to said further contact terminal and to one of said measurement circuit and said configuration circuit, said second enable circuit being driven by said second comparison circuit.

17. The semiconductor module according to claim 16, wherein said measurement circuit for ascertaining test data regarding the method of operation of the semiconductor module contains:
   a third shift register coupled to said further contact terminal and serially receiving parameter signal sequences for executing a test sequence;
   a control unit connected to said third shift register and to said second reception circuit; and
   a measurement unit connected to and controlled by said control unit and measuring electrical parameters for ascertaining test data regarding the method of operation of the semiconductor module.

18. The semiconductor module according to claim 16, wherein said configuration circuit for configuring the semiconductor module contains:
   a third shift register coupled to said further contact terminal and serially receiving parameter signal sequences for executing a configuration process;
   a control unit connected to said third shift register and to said second reception circuit; and
   a configuration register connected to said control unit and storing configuration settings.

19. The semiconductor module according to claim 11, further comprising:
   a measurement circuit for ascertaining test data regarding a method of operation of the semiconductor module; and
   an output circuit connected to said further contact terminal and to said measurement circuit, said output circuit outputting the test data which have been ascertained toward an outside through said further contact terminal.

20. The semiconductor module according to claim 19, wherein said output circuit can be used to output both analog and digital test data toward an outside through said further contact terminal.

21. The semiconductor module according to claim 11, further comprising:
   at least one additional further contact terminal which is not used for external data interchange, address interchange and/or command interchange during the normal operation of the semiconductor module;
   a measurement circuit for ascertaining test data regarding a method of operation of the semiconductor module; and
   an output circuit connected to said additional further contact terminal and to said measurement circuit, said output circuit outputting the test data which have been ascertained toward an outside through said additional further contact terminal.

22. The semiconductor module according to claim 21, wherein said output circuit is connected to said main circuit for testing the semiconductor module, said main circuit for testing the semiconductor module enabling said output circuit for outputting the test data which have been ascertained.

23. The semiconductor module according to claim 11, further comprising:
   a measurement circuit for ascertaining test data regarding a method of operation of the semiconductor module; and
   an output circuit connected to at least one of said contact terminals and to said measurement circuit, said output circuit outputting the test data which have been ascertained toward an outside through said one of said contact terminals.

24. A method for functionally testing a semiconductor module having a plurality of contact terminals provided for external data interchange, address interchange and/or command interchange during normal operation of the semiconductor module and at least one further contact terminal not used for external data interchange, address interchange and/or command interchange during the normal operation of the semiconductor module, which comprises the step of:
   initializing and setting a mode of operation for ascertaining and outputting test information during the normal operation of the semiconductor module through the further contact terminal, with data interchange, address interchange and/or command interchange simultaneously being effected during the normal operation of the semiconductor module through the contact terminals;

performing an input code evaluation by interrogating a state of the further contact terminal, the evaluation being executed until an interrogated input code for initializing a test sequence or a configuration sequence matches a predetermined input code;

performing a function code evaluation by interrogating a state of the further contact terminal if a result of the input code evaluation is positive, the evaluation being executed until an interrogated function code for setting a test sequence or a configuration sequence matches a predetermined function code; and subsequently outputting test information during the normal operation of the semiconductor module or configuring the semiconductor module.

25. The method according to claim 24, which further comprises:

performing a parameter evaluation for executing the test sequence or the configuration sequence by interrogating the state of the further contact terminal if a result of the function code evaluation is positive; and subsequently outputting the test information during the normal operation of the semiconductor module or configure the semiconductor module.

26. The method according to claim 24, which further comprises:

decoding an output start command at the further contact terminal for outputting the test information; and outputting the test information through another contact terminal until an output stop command is decoded at the further contact terminal.

27. A method for configuring a semiconductor module having a plurality of contact terminals used for external data interchange, address interchange and/or command interchange during normal operation of the semiconductor module and at least one further contact terminal not used for external data interchange, address interchange and/or command interchange during the normal operation of the semiconductor module, which comprises the steps of:

initializing and setting a mode of operation for configuring the semiconductor module during the normal operation of the semiconductor module through the further contact terminal, with data interchange, address interchange and/or command interchange simultaneously being effected during the normal operation of the semiconductor module through the contact terminals;

performing an input code evaluation by interrogating a state of the further contact terminal, the evaluation being executed until an interrogated input code for initializing a test sequence or a configuration sequence matches a predetermined input code;

performing a function code evaluation by interrogating the state of the further contact terminal if a result of the input code evaluation is positive, the evaluation being executed until an interrogated function code for setting the test sequence or the configuration sequence matches a predetermined function code; and subsequently outputting test information during the normal operation of the semiconductor module or configuring the semiconductor module.

28. The method according to claim 27, which further comprises:

performing a parameter evaluation for executing the test sequence or the configuration sequence by interrogating the state of the further contact terminal if a result of the function code evaluation is positive; and subsequently outputting the test information during the normal operation of the semiconductor module or configure the semiconductor module.

29. The method according to claim 27, which further comprises:

decoding an output start command at the further contact terminal for outputting the test information; and outputting the test information through another contact terminal until an output stop command is decoded at the further contact terminal.

* * * * *